United States Patent [19]

Cox, Jr.

[11] 4,079,374

[45] Mar. 14, 1978

[54] DIGITAL RESOLVER-TRACKING LOOP

[75] Inventor: Duncan B. Cox, Jr., Manchester, Mass.

[73] Assignee: The Charles Stark Draper Laboratory, Inc., Cambridge, Mass.

[21] Appl. No.: 761,788

[22] Filed: Jan. 24, 1977

[51] Int. Cl.² ............................................ H03K 13/02
[52] U.S. Cl. .............................................. 340/347 SY
[58] Field of Search ................... 340/347 SY, 347 M; 235/186; 323/103, 104; 318/608, 603

[56] References Cited

U.S. PATENT DOCUMENTS

| | | | |
|---|---|---|---|
| 3,564,539 | 2/1971 | Dew | 340/347 SY |
| 3,706,092 | 12/1972 | Cox, Jr. | 340/347 SY |
| 3,878,535 | 4/1975 | Twiss | 340/347 SY |
| 3,984,831 | 10/1976 | Jones | 340/347 SY |

Primary Examiner—Charles D. Miller
Attorney, Agent, or Firm—Robert F. O'Connell

[57] ABSTRACT

A system for tracking a pair of analog output signals from a resolver wherein such signals are hard-limited to provide square wave representations thereof, such hard limited signals being supplied to at least one digital phase-locked loop in which the phases thereof are compared with those of a pair of square wave digitized feedback signals to produce an error signal. The error signal is digitally integrated to produce a control signal for controllably changing the number of pulses in a pulsed clock signal which is supplied to a feedback counter for producing the pair of feedback signals having phases which are thereby changing so as to minimize the error signal.

21 Claims, 6 Drawing Figures

DIGITAL RESOLVER-TRACKING LOOP

INTRODUCTION

This invention relates generally to resolver tracking systems and, more particularly, to a resolver tracking loop which is digital in form and utilizes two signals from the output of a resolver.

BACKGROUND OF THE INVENTION

In many applications it is desirable to convert continuous, i.e., analog, information, such as the angle of a shaft, into a digital form to allow processing by a digital computer. For example, a typical device, such as a resolver, provides signal outputs which are representative of a shaft angle and it is desirable to convert such information to digital form, the digital information thereby accurately tracking the analog information from the resolver.

One approach to such process is described in U.S. Pat. No. 3,667,031, issued on May 30, 1972 to Cox et al. In accordance therewith, the output of a resolver is continuously tracked by utilizing an analog, phase-locked feedback loop which tracks the modulated resolver output wave forms in a highly accurate manner. In a dual-input form, the analog, phase-locked loop incorporates two phase-sensitive detectors, each detector operating on one of the output signals from the windings of the resolver, and the circuit is configured so as to provide resolver-angle to phase-angle conversion is an improved manner. Such a system reduces the conversion errors which arise due to resolver excitation amplitude mismatches and to phase-detector gain mismatches. Further, such a system reduces errors which are due to resolver input signals being out of exact quadrature.

A disadvantage of such a system, however, lies in the high costs of the components thereof which costs make the use of such a dual-input analog, phase-locked loop system too expensive for many applications. It is desirable, therefore, to design a system which will provide accurate resolver output tracking at much less cost than that of the system disclosed in the aforementioned Cox et al. patent.

BRIEF SUMMARY OF THE INVENTION

This invention comprises a dual-input digital, phase-locked loop for providing the desired resolver output tracking operation. While the digital, phase-locked loop of the invention is similar to those discussed in the previously filed U.S. patent application, Ser. No. 512,733, filed on Oct. 7, 1974 by Cox et al., as well as in the articles "A New Integrated Circuit Digital Phase-Locked Loop", Lee et al., Proc. IEEE 1975 National Aerospace and Electronics Conference (NAECON), June 1975, pp 377-383, and "The Development of a Digital Phase-Locked Loop Integrated Circuit", Horton, Proc. IEEE 1976 National Aerospace and Electronics Conference (NAECON), May 1976, pp. 938-947, and in U.S. patent application Ser. No. 691,581, filed on June 1, 1976 by Lee et al., the system of the invention is uniquely arranged so as to be especially adapted for use with dual phase-modulated outputs of a resolver-type, angular transducer. The invention thereby provides a flexible, digitally programmable, and easily packaged resolver tracking system the cost of which is considerably reduced over that required when using the prior art analog, phase-locked system. The use of a digital, phase-locked loop avoids the necessity for utilizing precision analog (i.e., continuous, non-digital) devices, such as phase detectors, low-pass filters, voltage controlled oscillators, and the like, as well as the need for large passive components, such as capacitors, which typically drift with temperature and require some form of temperature compensation, which requirement further increases the costs thereof.

In accordance with the invention, the resolver phase-modulated output signals are supplied to appropriate hard-limiter circuits to produce two digitized resolver signals each of which is supplied to a separate phase sensitive detector circuit, the outputs of which are appropriately combined to provide an input for an up-down counter. The up-down counter produces a pair of control signals which are supplied to an increment/decrement circuit for either adding or deleting a pulse to or from a pulsed input signal thereto so that the incremented or decremented output signal, when appropriately divided by a suitable modulus in a feed-back counter, produces a pair of signals whose phase tracks the phase of the digitized resolver output signals at the phase sensitive detector inputs.

DESCRIPTION OF THE INVENTION

The system of the invention can be described in more detail with the help of the accompanying drawings wherein FIG. 1 shows a block diagram of one embodiment of the invention;

Figures 1, 1A:
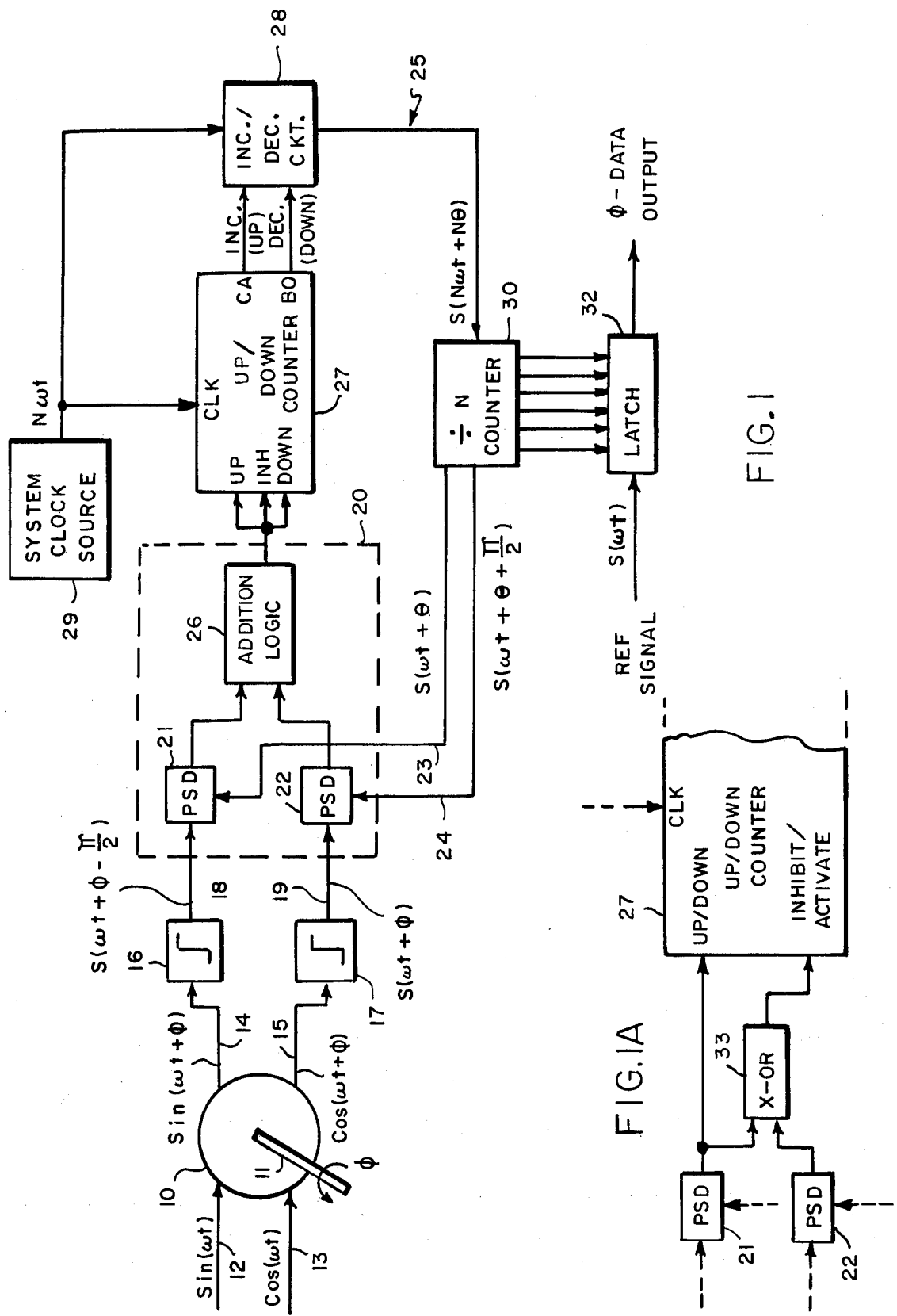

As can be seen in FIG. 1, a resolver 10 is driven by a rotating shaft 11, the angle of the shaft being designated as the angle $\phi$, as shown by the arrow associated therewith. As pair of input signals 12 and 13 to the resolver may, for example, be in the form of analog sine wave signals identified as $\sin(\omega t)$ and $\cos(\omega t)$. The resolver of the type utilized in the system of the invention is a dual output device providing a pair of output signals in quadrature, the phases of which are modulated by the angle $\phi$ of the rotating shaft 11, such output signals 14 and 15 being depicted in FIG. 1 as being of the form $\sin(\omega t + \phi)$ and $\cos(\omega t + \phi)$. Such signals are digitized by supplying them to a pair of hard limiters 16 and 17, respectively, which limit the amplitudes thereof to a preselected level in accordance with conventional techniques to produce a pair of square wave signals 18 and 19 designated in FIG. 1 as being of the form $S(\omega t + \phi - \pi/2)$ and $S(\omega t + \phi)$, wherein S designates the square wave character of the signal.

The latter signals are supplied to a phase detector 20 which comprises a first phase sensitive detector circuit 21, a second phase sensitive detector circuit 22, and addition logic 26. Detector circuit 21 compares the phases of signal 18 and a tracking signal 23 of the form $S(\omega t + \phi)$ which, when the tracking error is zero, is in quadrature with signal 18, while detector circuit 22 compares the phases of signal 19 and a tracking signal 24 of the form $S(\omega t + \theta + \pi/2)$ which, when the tracking error is zero, is in quadrature with signal 19. The latter tracking signals are obtained from the digital resolver tracking loop 25, as discussed in more detail below, the object of the loop being to provide tracking signals wherein $\theta = \phi$ so that such signals track the digitized output signals from resolver 10.

The output signals from detectors 21 and 22 are supplied to addition logic circuitry 26 which in effect adds the signals in a manner such as to produce an effective three-state signal, as discussed below, for supply to an up-down counter 27. The three-state signal is effectively supplied to the up-down counter so as to cause it to count up, to count down or to inhibit its counting action depending on the state of the three-state signal, represented diagrammatically only by the up, down, and inhibit designations in counter 27. The latter signal in effect represents an error signal, the magnitude of which is determined by the phase differences between the tracking signals and the resolver output signals. Up-down counter 27 is in effect a digitial integrator which integrates the error signal by counting up or down, depending on the sign of the error signal, or by refraining from counting (inhibiting its counting action) when the error signal is zero. Thus, such overall operation is in effect an addition and integration operation, the error signal being thereby integrated in either direction to modulus K, at which point the counter overflows to produce either a carry output pulse (when counting up to K) or a borrow output (when counting down to zero) at a frequency proportional to the average error.

The carry and borrow output pulse signals act as control signals for an increment/decrement circuit 28 which is also supplied with a clock signal from a system clock source 29. The latter source also supplies a clock signal to the up-down counter 27, as shown. The output of the increment/decrement circuit is a signal having a pulse rate equal to the clock input signal thereto as long as neither an "up" nor a "down" control pulse is present. When an up control pulse signal is present, a pulse is added to the input clock signal and when a down control pulse signal is present a pulse is detected from the input clock signal. The output of increment/decrement circuit 28 is of the form $S(N\omega t + N\theta)$ and is supplied to divide-by-N feedback counter circuitry 30 which produces a square wave 23 of the form $S(\omega t + \theta)$ and a square wave signal 24 of the form $S(\omega t + \theta \pi/2)$ which is phase shifted by 90° with respect to signal 23, these signals being available from such counter circuitry in a manner well known to the art.

When $\theta = \phi$, the latter signals 23 and 24 are accurately tracking the resolver output signals and a parallel digital signal may be obtained from divide-by-N counter 30 for deriving an appropriate digital data output signal which is representative of the shaft angle $\phi$ by means of an appropriate latching circuit 32. The latter circuit is supplied with a reference strobe signal of the form $S(\omega t)$, the operation of the latching circuit 32 in combination with the divide-by-N counter 30 being the same as that described, for example, in previously issued U.S. Pat. No. 3,706,092, issued on Dec. 12, 1972, to Duncan B. Cox, Jr., et al.

The operation of the system in FIG. 1 can be described as follows. A conventional resolver 10, having a shaft angle position $\phi$, is driven with sine and cosine excitation signals 12 and 13. The resolver outputs are phase-modulated sinusoidal signals 14 and 15 which are in quadrature, the phase $\phi$ thereof being proportional to the angle of the resolver shaft. Hard limiters 16 and 17 provide square-wave output signals which are in turn supplied to the phase sensitive detectors 21 and 22. The latter circuitry may be implemented in any appropriate manner well known to those in the art. One technique, for example, for providing phase sensitive detection of the input square-wave signals thereto is by using exclusive-OR (X-OR) logic elements.

The outputs thereof (considered to represent values of +1 or −1, for example) are then appropriately added to one another, through suitable addition logic circuitry 26, for subsequent integration by the counter 27. The outputs of the phase sensitive detectors are two-state pulse-width modulated signals. During intervals when the three-state signal takes on plus or minus values (the outputs from detectors 21 and 22 agree), the up-down counter 27 is made to count upward or downward, respectively, at a reference frequency $N\omega t$. During intervals when the three-state signal takes on a zero value, the up-down counter is inhibited from counting.

The desired addition of the phase sensitive detector outputs and the control of the up-down counter operation can be accomplished, for example, by a technique which uses the two-state outputs from either of the phase sensitive detectors to control the direction of counting (when the outputs agree) and uses an exclusive-OR combination of the phase sensitive detector outputs to control whether the counter is activated or inhibited (the counter being inhibited from counting when the outputs disagree).

One particular embodiment of such technique is shown in FIG. 1A, wherein the outputs from phase sensitive detectors 21 and 22 of FIG. 1 are supplied to an exclusive-OR (X-OR) circuit 33 which, when such outputs disagree (differ in sign), provides a signal of such a state as to inhibit the operation of the counter 27, and, when such outputs agree (have the same sign), provides a signal of such a state as to activate the counting operation of counter 27. One of the phase sensitive detector outputs (in this case from the detector 21) is supplied to the up-down input of the counter 27 so as to cause the counter to count either up or down depending on the sign of the output from detector 21, so long as an inhibit signal is not produced by exclusive-OR circuit 33. The effective three-state pulse-width modulated signal which is provided at the up-down counter 27 represents the loop error signal in digital form, such error signal being proportional to the difference between $\phi$ and $\theta$, the loop thereby operating so as to cause $\phi$ to tend to equal $\theta$, thereby reducing the error to a minimum.

The up-down counter 27 in effect digitally integrates the error signal by counting a reference frequency ($N\omega t$) from the system clock (supplied to the clock input of the counter), the error signal thereby causing the counter to count up or down, or not at all, depending on the state thereof.

The increment/decrement control signals are supplied to the increment/decrement circuit so as to either add or delete a pulse from the reference clock signal ($N\omega t$) depending on whether the output signals 23 and 24 from the divide-by-N counter 30 are to be advanced or retarded. The pulse train output from increment-/decrement circuit 28 is used as the clock input signal to the binary divide-by-N counter 30, the most significant bit of which is used as a feedback reference signal 23 in the form $S(\omega t + \theta)$. Such signal is supplied to phase sensitive detector 21 for comparison with signal 18, while the signal 24 is phase shifted by 90° to produce a signal of the form $S(\omega t + \theta + \pi/2)$ for comparison with signal 19 at phase sensitive detector 22.

The overall system thereby produces a digitized output signal representative of $\phi$ the shaft angle of resolver 10, in a manner which is much less costly than the system of the analog phase lock loop described in the above referenced U.S. Pat. No. 3,667,031. Moreover, the system of the invention has a capability of providing error reduction which is comparable to that of the analog, phase-locked loop system used with a double-input, double-output resolver as described in said patent.

Figure 2:
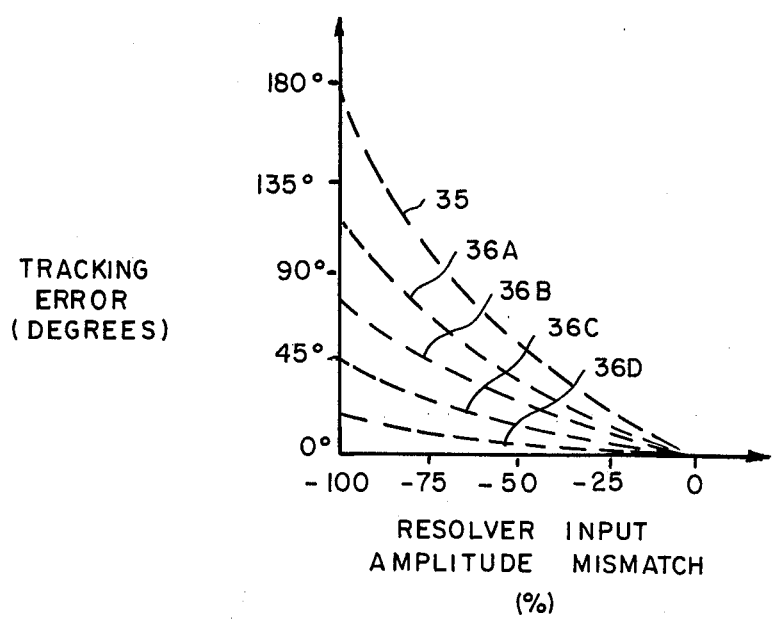
FIGS. 2 and 3 show contrasting graphs of tracking errors as a function of resolver input excitation amplitude mismatch for a typical prior art system and the system of the invention, respectively.

As can be seen in FIG. 2, the single-input analog tracking loop of the previously described system of the above-referenced Cox et al. U.S. Pat. No. 3,667,031, when used with a resolver having two inputs and a single output signal for supply to the loop provides a tracking error as a function of the amplitude mismatch between the two resolver input signals as shown by the curve 35 therein. If the resolver is converted to a double-output resolver supplied to a dual-input analog tracking loop, the tracking error can be reduced as shown by exemplary curves 36A, 36B, etc. of FIG. 2, the effectiveness of the tracking error reduction depending on the ability to correctly balance the gains of the phase detector circuitry thereof. Perfect or near-perfect balancing minimizes the tracking error substantially over the entire range of resolver input mismatch, as shown by exemplary curve 36D.

Figure 3:
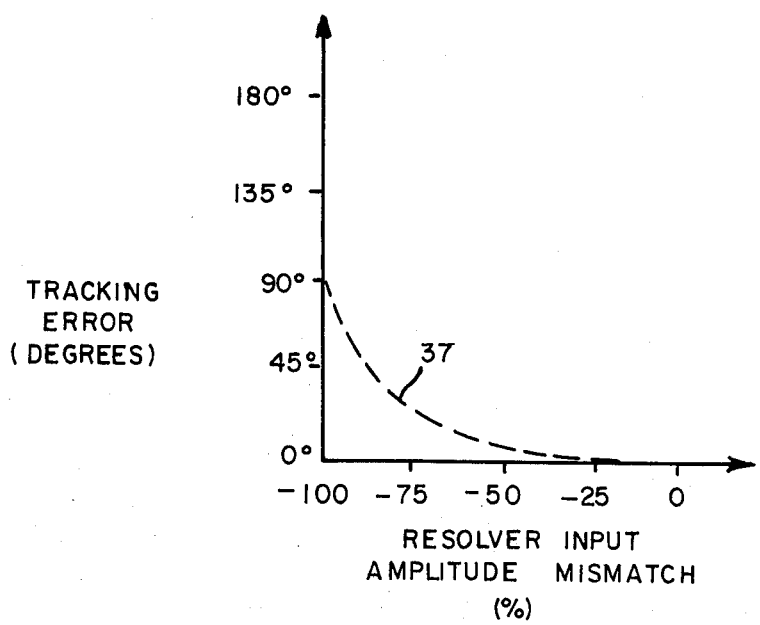

In contrast, FIG. 3 shows a graphical representation of the tracking error as a function of resolver input amplitude mismatch for a dual-output resolver supplying digitized inputs to the dual-input digital tracking loop of the invention. As can be seen by the curve 37 therein, the tracking error remains relatively small as compared with curve 35 of FIG. 2 over the whole range of resolver input mismatches and is extremely small for mismatches up to about 25 percent. Since the dual input signals supplied to the tracking loop are digitized, the system of the invention does not give rise to any amplitude balancing problem at the phase detectors, since only the phase changes (no amplitude changes) are sensed in contrast with the prior art analog tracking loop systems.

Thus, even though sensing only phase changes, the system of the invention can provide excellent error minimization even with up to relatively high resolver input amplitude mismatches. Since such high mismatches would not normally occur in most practical applications when using dual-input, dual-output resolvers, such system is comparable in its error reduction capabilities, and, hence, in the accuracy of its tracking ability, with the prior art analog tracking loop systems. The cost of the digital tracking loop system of the invention, however, is considerably less than that of the analog system and, hence, the invention offers important economic advantages thereover.

Figure 4:
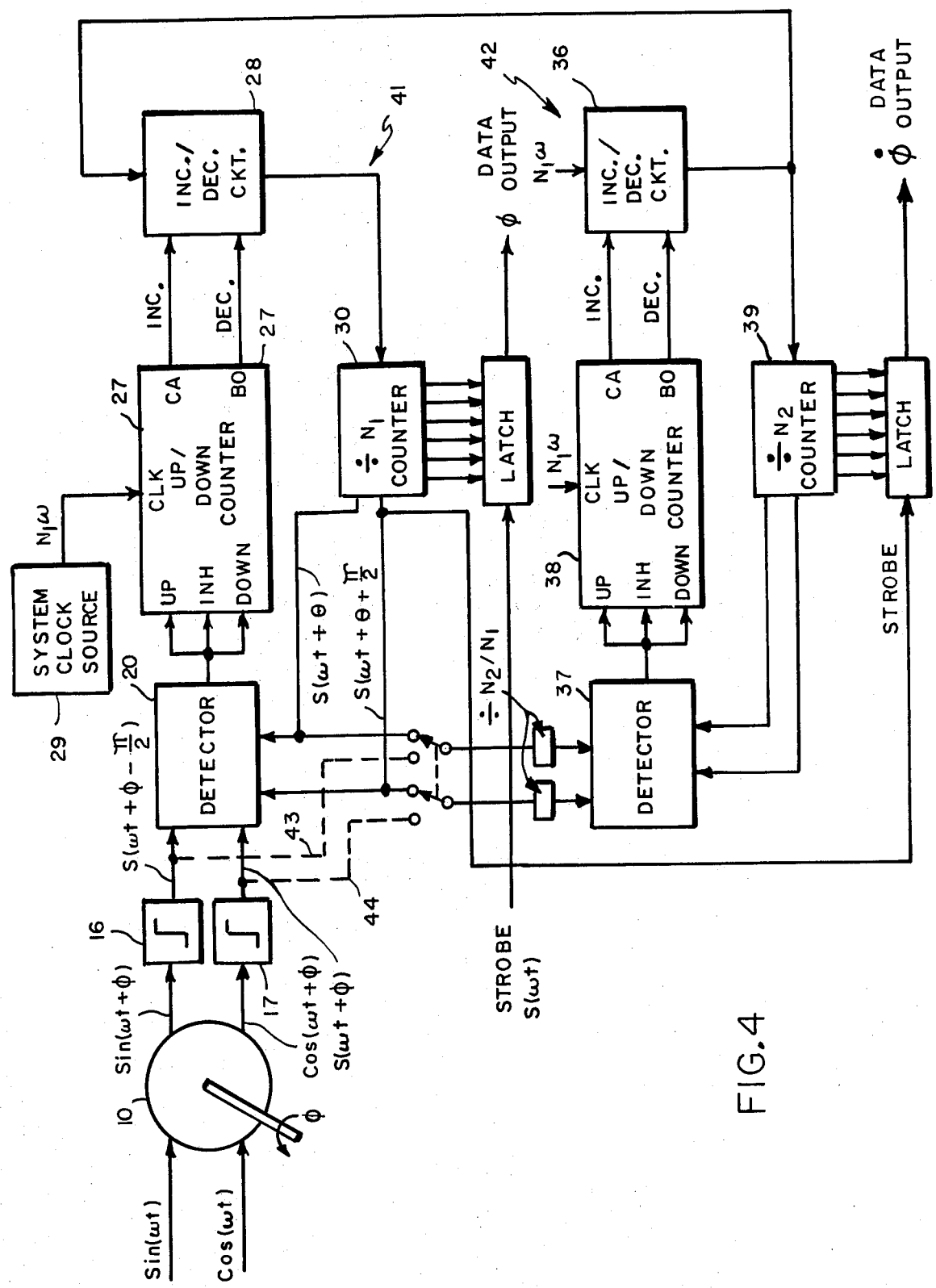
FIG. 4 shows a block diagram of an alternative embodiment of the invention.

The digital, phase-locked loop of the system shown in FIG. 1 can be extended to provide higher order loop networks, as shown in FIG. 4, which depicts, for example, a second order system for converting analog resolver shaft angle information both to digital shaft angle position information ($\phi$) and to digital shaft angle velocity information ($\dot{\phi}$). As can be seen therein, the resolver, as before, provides two resolver output signals which are each hard limited by limiter circuits 16 and 17 for supply to a first digital, phase-locked tracking loop 41 comprising detector circuitry 20 which includes the phase sensitive detectors 21 and 22 and subtract logic 26, as discussed above with reference to FIG. 1. The output of logic 26 supplies a threestate input signal to up-down counter 27, which in turn, as explained in connection with FIG. 1, produces increment and decrement control signals for increment/decrement circuit 28 which in turn supplies a pulse train signal to a divide-by-$N_1$ feedback counter 30. The input clock signal for increment/decrement circuit 28 is supplied from the output of an increment/decrement circuit 36 of a second digital, tracking loop 42, the latter increment/decrement circuit being supplied with the system clock signal from clock source 29 having a frequency ($N_1\omega t$). The frequencies of the output signals from the first loop 41, i.e., the output signals from the divide-by-$N_1$ counter 30, are each frequency divided by the ratio $N_2/N_1$, as by a divider counter, and supplied to a detector circuit 37 of the second loop 42 which latter circuit includes a pair of phase sensitive detectors and subtraction logic for producing a similar three-state signal for an up-down counter 38. The increment/decrement control signals from up-down counter 38 are supplied to increment/decrement circuit 36, the output of which is supplied not only as the pulse clock signal to the increment/decrement circuit 28 of loop 41, but also to a divide-by-$N_2$ feedback counter 39 which supplies signal outputs, which are phase shifted 90° with respect to each other, as discussed above with reference to counter 30, to detector 37.

The second-order loop 42 tends to compensate for changes in $\phi$ as a function of time by adjusting the frequency of the clock input to increment/decrement circuit 28, so as to permit the phase errors of loop 41 to tend toward zero when dynamic changes in $\phi$ are present (i.e., when $\dot{\phi}$ is greater than zero). If $\phi$ never changes (i.e., $\dot{\phi}$ is essentially zero), the second order loop 42 is not necessary. Thus, it provides the well-known advantages of a second order loop system for dynamic performance. When such changes occur at a constant rate the error tends toward zero if the second order loop system is used but will not do so as effectively if only a first order loop system is used.

In order to explain the operation of the second-order, digital tracking loop system of FIG. 4, let it be assumed initially that the loops are in phase lock so that $\phi_{in}$ is essentially equal to $\phi_{out}$ and $\div N_1$-counter 30 is in phase with $\div N_2$-counter 39 whereby the inputs to detector 37 are in phase. Under such conditions up-down counter 38 does not generate either increment or decrement control signal so that the output of increment/decrement circuit 36 is the frequency $N_1\omega$ of the system clock signal, the latter frequency also being the clock signal input to increment/decrement circuit 28.

If it is then assumed that $\phi_n$ then changes by a small amount, and that the rate of such change is essentially a constant one, there will be an increase in the phase error between $\phi_{in}$ and $\theta_{out}$ in loop 41. Such phase error is integrated by up-down counter 27 to produce an appropriate increment or decrement control signal which is applied to circuit 28 either to advance or to retard the phase of the count of the $\div N_1$-counter 30 by $1/N_1$ cycles. With such a change in the phase of the output of $\div N_1$-counter 30, the inputs to detector 37 are no longer in phase and a phase error is produced in loop 42 for integration by up-down counter 38. Such operation produces either an increment or decrement control signal from counter 38 to advance or to regard the phase of $\div N_2$-counter 39 by $1/N_2$ cycles. However, since the clock signal for the increment/decrement circuit 28 is obtained from the output of increment-/decrement circuit 36, the phase of ÷ $N_1$-counter 30 is also advanced or retarded by the same amount. Loop 42, therefore, continues to integrate the same phase error so that a constant frequency is added to $N_1\omega$ by increment/decrement circuit 36. Such operation also means that a substantially constant phase rate is added to $\Theta_{out}$. The process continues until $\phi_{in}$ is equal to $\theta_{out}$ and the constant phase rate which is added to $\theta_{out}$ by the second loop 42 is equal to the constant rate of phase change of the input $\phi_{in}$.

The second-order digital, phase-locked loop system of FIG. 4 provides a digital readout of the input phase ($\phi_{in}$) when the ÷ $N_1$-counter 30 is appropriately strobed by a reference signal at the frequency $f_c$, as discussed above with reference to FIG. 1, and a digital readout of the input rate of change of the phase ($\dot\phi_{in}$) when the contents of the ÷ $N_2$-counter 39 are appropriately strobed by the output of the ÷ $N_1$-counter 30.

Alternatively, the input signals to the second loop 42 may be taken from the outputs of limiter circuits 16 and 17, as shown by the dashed lines 43 and 44 in FIG. 4, appropriately divided in frequency by the ratio $N_2/N_1$ as above, instead of from the first loop outputs discussed above. For clarity, the alternative arrangement is depicted diagrammatically by the switch configuration 31.

Figure 5:
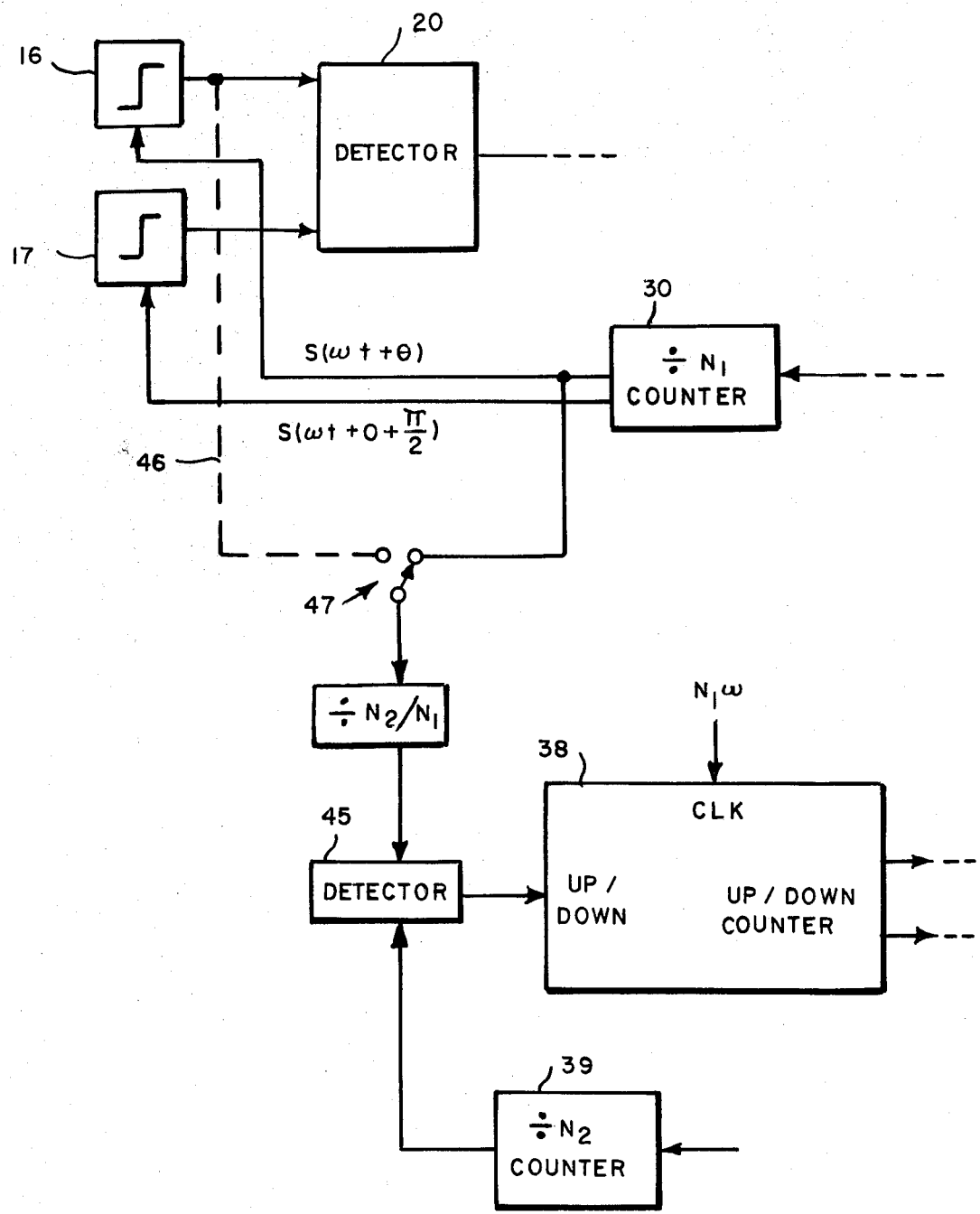
FIGS. 5 shows a block diagram of still another alternative embodiment of the invention.

In a still further alternative embodiment, the second loop 42 may operate with a single output signal as shown in FIG. 5 in which only pertinent portions of the second order loop system of FIG. 4 are shown. Such input signal is taken from the $S(\omega t + \theta)$ output of ÷ $N_1$-counter 30, appropriately divided in frequency by the ratio $N_2/N_1$ and supplied to a single phase detector circuit 45, the other input of which is taken from the single non-phase shifted output of ÷ $N_2$-counter 39. Further, the output of phase detector 45 is a two-state signal which is supplied to the up/down input of counter 38, as shown. Alternatively, as single resolver output signal from limiter 16 may also be supplied to phase detection circuit 45, as shown by the dashed line 46 and switch 47. The general operation of such alternative embodiment of FIG. 5 is substantially as described with reference to FIG. 4.

While the configurations discussed above with reference to FIGS. 4 and 5 utilize a different (preferably lower) frequency in the second loop than in the first loop in order to enable the second looped to operate over an extended frequency range, in some applications it may be as desirable and effective to operate both loops at the same frequency so that $N_1 = N_2$ so that the frequency division operation, by the ratio $N_2/N_1$ is not required.

Thus, the system of the invention can be implemented as either a first order system, as shown in FIG. 1, or a second order system, as shown in FIGS. 4 and 5, all of which operate in digital modes utilizing digitized resolver output information as provided by the hard limiter circuits 16 and 17, as discussed above. Such systems are digitally programmable in terms of bandwidth and center frequency and also in terms of the damping ratios when considering the second order system, for example, in FIG. 4. Such systems are relatively insensitive to temperature variations which often cause drift problems in the passive components used in analog systems. Moreover, the circuit implementation of the invention is relatively simple and much less expensive in comparison with the analog system previously disclosed by the prior arts. With the greater availability of large-scale-integrated digital circuit chips, the system can be implemented with relatively few parts and manufactured at reduced cost as compared with the parts required in an analog system requiring discrete components.

While the embodiments of the invention disclosed above are preferred embodiments thereof, modifications thereof will occur to those skilled in the art within the spirit and the scope of the invention, and, hence, the invention is not to be construed as limited thereto except as defined by the appended claims.

What is claimed is:

1. A system for processing a pair of analog output signals from a resolver, the phases of said signals being modulated in accordance with the angular position of a rotary member of said resolver, said system comprising at least one digital tracking loop comprising means for converting said pair of analog resolver output signals to a pair of digitized resolver output signals the phases of which are modulated in accordance with said angular position;

first phase sensing means responsive to said pair of digitized resolver output signals and to a first pair of digitized feedback signals for producing a first error signal which is a function of the phase differences between said pair of digitized resolver output signals and said pair of digitized feedback signals;

first means responsive to said first error signal for digitally integrating said first error signal and for generating a first control signal which is a function of said digitally integrated error signal;

first means responsive to said control signal and to a pulsed clock signal for controllably changing the number of pulses in said pulsed clock signal to produce a first intermediate signal having a controlled pulse rate; and first feedback means responsive to said first intermediate signal for changing the pulse rate thereof by a first selected factor to produce said first pair of digitized feedback signals and to produce a first output signal representative of the angular position of said rotary member.

2. A system in accordance with claim 1 wherein said pair of analog resolver output signals are in phase quadrature and said digitized feedback signals producing means produces digitized signals which are also in phase quadrature.

3. A system in accordance with claim 2, wherein said digital integrating means is a digital counter means.

4. A system in accordance with claim 3 wherein said first phase sensing means comprises a first phase comparison means responsive to said first digitized resolver output signal and to said first digitized feedback signal for producing a first comparison signal representing the phase difference therebetween;

a second phase comparision means responsive to said second digitized resolver output signal and to said second digitized feedback signal for producing a second comparison signal representing the phase difference therebetween; and first means for combining said first and second comparison signals to produce said error signal.

5. A system in accordance with claim 4 wherein said digital counter means is an up-down counter.

6. A system in accordance with claim 5 wherein said first and second phase comparison means are first and second exclusive-OR elements, respectively.

7. A system in accordance with claim 5 wherein said error signal controls the activation of said up-down counter means and controls the direction of the count of said up-down counter means when activated.

8. A system in accordance with claim 7 wherein said first combining means includes means responsive to said first and second phase comparison signals for producing a counter control signal, said counter means being responsive thereto to inhibit its counting operation when said first and second phase comparison signals disagree and to activate its counting operation when said first and second phase comparison signals agree; and said counter means being further responsive to one of said first and second phase comparison signals to control the direction of the counting operation thereof when said first and second phase comparison signals agree.

9. A system in accordance with claim 8 wherein said counter control signal producing means is an exclusive-OR logic circuit.

10. A system in accordance with claim 1 wherein said first intermediate signal producing means includes a dividing counter means for dividing the pulse rate of said first intermediate signal by said first selected factor.

11. A system in accordance with claim 1 wherein said converting means are hard limiter circuits so that the said pair of digitized resolver outputs signals are each in square wave form; and said first feedback means provides said first pair of digitized feedback signals in square wave form.

12. A system in accordance with claim 1 and further including at least a second digital tracking loop comprising second phase sensitive means responsive to at least one second loop input signal selected from said pair of digitized resolver output signals and said first pair of digitized feedback signals and responsive to at least one second digitized feedback signal for producing a second error signal as a function of the phase difference therebetween;

means responsive to said second error signal for digitally integrating said second error signal and for generating a second control signal as a function of said digitally integrated second error signal;

means responsive to said second control signal and to a second pulsed clock signal for controllably changing the number of pulses in said second pulsed clock signal to produce a second intermediate signal having a controlled pulse rate, said second intermediate signal being supplied as the pulsed clock signal to said first intermediate signal producing means; and second feedback means responsive to said second intermediate signal for changing the pulse rate thereof by a second selected factor to produce said at least on second digitized feedback signal.

13. A system in accordance with claim 12 and further wherein said second feedback means produces a second output signal representative of the rate of change of said angular position of said rotary member.

14. A system in accordance with claim 12 wherein said at least one second digitized feedback signal comprises a second pair of digitized feedback signals; and further wherein said second phase sensitive means is responsive to at least one of said first pair of digitized feedback signals and to at least one of said second pair of digitized feedback signals.

15. A system in accordance with claim 1 wherein said second phase sensitive means is responsive to one of said first pair of digitized feedback signals and to one of said second pair of digitized feedback signals.

16. A system in accordance with claim 14 wherein said second phase sensitive means is responsive to said first pair of digitized feedback signals and to said second pair of digitized feedback signals.

17. A system in accordance with claim 12 wherein said at least one second digitized feedback signal comprises a second pair of digitized feedback signals and further wherein said second phase sensitive means is responsive to at least one of said pair of digitized resolver output signals and to at least one of said second pair of digitized feedback systems.

18. A system in accordance with claim 17 wherein said second phase sensitive means is responsive to one of said pair of digitized resolver output signals and to one of said second pair of digitized feedback signals.

19. A system in accordance with claim 17 wherein said second phase sensitive means is responsive to said pair of resolver output signals and to said second pair of digitized feedback signals.

20. A system in accordance with claim 12 wherein said first and second selected factors are equal.

21. A system in accordance with claim 12 wherein said first and second selected factors are unequal and further including means for dividing the frequency of said at least one second loop input signal by a third factor equal to the ratio of said second selected factor to said first selected factor.

* * * * *